(12) United States Patent
Jin et al.

(10) Patent No.: US 9,997,647 B2
(45) Date of Patent: Jun. 12, 2018

(54) SOLAR CELLS AND MANUFACTURING METHOD THEREOF

(75) Inventors: Yoonsil Jin, Seoul (KR); Goohwan Shim, Seoul (KR); Youngho Choe, Seoul (KR); Jaewon Chang, Seoul (KR)

(73) Assignee: LG ELECTRONICS INC., Seoul (KR)

(*) Notice: Subject to any disclaimer, the term of this patent is extended or adjusted under 35 U.S.C. 154(b) by 223 days.

(21) Appl. No.: 13/978,056

(22) PCT Filed: Jan. 4, 2012

(86) PCT No.: PCT/KR2012/000073
§ 371 (c)(1),
(2), (4) Date: Jul. 2, 2013

(87) PCT Pub. No.: WO2012/093845
PCT Pub. Date: Jul. 12, 2012

(65) Prior Publication Data
US 2013/0284259 A1    Oct. 31, 2013

(30) Foreign Application Priority Data
Jan. 5, 2011    (KR) .................. 10-2011-0000856

(51) Int. Cl.
*H01L 31/0224* (2006.01)
*H01L 31/0216* (2014.01)
*H01L 31/068* (2012.01)

(52) U.S. Cl.
CPC ........... *H01L 31/022425* (2013.01); *H01L 31/02167* (2013.01); *H01L 31/022433* (2013.01); *H01L 31/068* (2013.01); *Y02E 10/547* (2013.01)

(58) Field of Classification Search
USPC ........................................ 136/255
See application file for complete search history.

(56) References Cited

U.S. PATENT DOCUMENTS

| 5,397,400 A * | 3/1995 | Matsuno ........... H01L 31/02168 |
| | | 136/256 |
| 7,700,952 B2 | 4/2010 | Park et al. |
| (Continued) | | |

FOREIGN PATENT DOCUMENTS

| JP | 2005-116906 A | 4/2005 |
| KR | 10-2010-0137117 A | 12/2010 |
| WO | WO 2009157079 A1 * | 12/2009 ............. H01L 31/04 |

OTHER PUBLICATIONS

Schmidt, "Effective surface passivation of crystalline silicon using ultrathin Al2O3 films and Al2O3/SiNx stacks", physica status solidi (RRL)—Rapid Research Letters, vol. 3, Issue 9, pp. 287-289, Nov. 2009.*

*Primary Examiner* — Devina Pillay
(74) *Attorney, Agent, or Firm* — Birch, Stewart, Kolasch & Birch, LLP

(57) ABSTRACT

A solar cell and a method for manufacturing the same are disclosed. The solar cell includes a substrate, an emitter region positioned at one surface of the substrate, a first insulating layer including a lower layer positioned on the emitter region and an upper layer positioned on the lower layer, and a first electrode which is formed of a first conductive paste and is electrically connected to the emitter region. The first insulating layer includes a plurality of first contact holes, and a portion of the first electrode is filled in the plurality of first contact holes.

9 Claims, 7 Drawing Sheets

(56) References Cited

U.S. PATENT DOCUMENTS

| | | | |
|---|---|---|---|
| 2005/0133084 A1* | 6/2005 | Joge et al. | 136/255 |
| 2007/0169806 A1* | 7/2007 | Fork | H01L 31/022425 |
| | | | 136/256 |
| 2008/0017243 A1* | 1/2008 | De Ceuster | H01L 31/022425 |
| | | | 136/255 |
| 2009/0007962 A1* | 1/2009 | Wenham | H01L 21/743 |
| | | | 136/256 |
| 2009/0008787 A1* | 1/2009 | Wenham | H01L 21/743 |
| | | | 257/773 |
| 2009/0114276 A1* | 5/2009 | Shan | H01L 31/0516 |
| | | | 136/256 |
| 2009/0286349 A1* | 11/2009 | Rohatgi et al. | 438/98 |
| 2009/0301559 A1 | 12/2009 | Rohatgi et al. | |
| 2010/0032017 A1 | 2/2010 | Bae | |
| 2010/0065117 A1* | 3/2010 | Kim et al. | 136/256 |
| 2010/0108134 A1 | 5/2010 | Ravi | |
| 2010/0224228 A1* | 9/2010 | Kim | H01L 31/022425 |
| | | | 136/244 |
| 2010/0258177 A1 | 10/2010 | Ko et al. | |
| 2011/0132444 A1* | 6/2011 | Meier et al. | 136/255 |
| 2011/0143486 A1* | 6/2011 | Hama et al. | 438/72 |

* cited by examiner

SOLAR CELLS AND MANUFACTURING METHOD THEREOF

BACKGROUND OF THE INVENTION

Field of the Invention

Embodiments of the invention relate to a solar cell and a method for manufacturing the same.

Description of the Related Art

Solar power generation to convert light energy into electric energy using a photoelectric conversion effect has been widely used as a method for obtaining eco-friendly energy. A solar power generation system using a plurality of solar cell modules has been installed in places, such as houses, due to an improvement of a photoelectric conversion efficiency of solar cells.

A solar cell generally includes a substrate and an emitter region forming a p-n junction along with the substrate. The solar cell generates an electric current using light incident through one surface of the substrate.

An anti-reflection layer is formed on a light receiving surface of the substrate, so as to reduce a reflectance of light incident on the substrate and increase a transmittance of light of a predetermined wavelength band. Hence, the anti-reflection layer increases a photoelectric conversion efficiency of the solar cell.

Because light is generally incident only on one surface of the substrate of the solar cell, a current conversion efficiency of the solar cell is low.

Accordingly, a bifacial solar cell, in which light is incident on both surfaces of the substrate, has been recently developed.

SUMMARY OF THE INVENTION

Embodiments of the invention provide a solar cell and a method for manufacturing the same capable of improving its efficiency.

In one aspect, there is a solar cell including a substrate, an emitter region positioned at one surface of the substrate, a first insulating layer including a lower layer positioned on the emitter region and an upper layer positioned on the lower layer, and a first electrode which is formed of a first conductive paste and is electrically connected to the emitter region, wherein the first insulating layer includes a plurality of first contact holes, and a portion of the first electrode is filled in the plurality of first contact holes.

The lower layer of the first insulating layer is formed of a passivation material having negative fixed charges, for example, aluminum oxide (AlO$_x$) or yttrium oxide (Y$_2$O$_3$).

The upper layer of the first insulating layer is formed of an anti-reflection coating material having positive fixed charges, for example, silicon nitride (SiNx).

The first electrode includes a plurality of front electrodes, which are separated from one another at regular intervals, and a plurality of front electrode current collectors positioned in a direction crossing the plurality of front electrodes.

The plurality of first contact holes may be formed in a formation area of the front electrodes. Each of the plurality of first contact holes may have a size less than a width of each front electrode.

The plurality of first contact holes may be formed in a formation area of the front electrode current collectors. Each of the plurality of first contact holes may have a size less than a width of each front electrode current collector.

The plurality of first contact holes may be formed in a formation area of the front electrodes and a formation area of the front electrode current collectors. A size of each of the plurality of first contact holes formed in the formation area of the front electrodes may be different from a size of each of the plurality of first contact holes formed in the formation area of the front electrode current collectors.

The size of each of the plurality of first contact holes formed in the formation area of the front electrodes may be less than the size of each of the plurality of first contact holes formed in the formation area of the front electrode current collectors. The size of each of the plurality of first contact holes formed in the formation area of the front electrodes may be less than a width of each front electrode, and the size of each of the plurality of first contact holes formed in the formation area of the front electrode current collectors may be less than a width of each front electrode current collector.

The solar cell may further include a back surface field region positioned at the other surface of the substrate, a second insulating layer positioned on a back surface of the back surface field region, and a second electrode which is formed of a second conductive paste and is electrically connected to the back surface field region.

The second insulating layer includes a plurality of second contact holes each having a dot shape. A portion of the second electrode is filled in the plurality of second contact holes.

The second electrode may include a plurality of back electrodes, which are separated from one another at regular intervals, and a plurality of back electrode current collectors positioned in a direction crossing the plurality of back electrodes.

The plurality of second contact holes may be formed in at least one of a formation area of the back electrodes and a formation area of the back electrode current collectors.

The substrate may be formed of n-type silicon wafer, on which phosphorus (P) is doped. The second insulating layer may have the same structure as the first insulating layer.

The one surface of the substrate, at which the emitter region is positioned, may be formed as a first textured surface, and the other surface of the substrate, at which the back surface field region is positioned, may be formed as a second textured surface.

In another aspect, there is a method for manufacturing a solar cell including forming an emitter region at one surface of a substrate and forming a back surface field region at the other surface of the substrate, forming a first insulating layer on the emitter region and forming a second insulating layer on a back surface of the back surface field region, forming a plurality of first contact holes in the first insulating layer and forming a plurality of second contact holes in the second insulating layer, and printing a first conductive paste on the first insulating layer at locations corresponding to the first contact holes to form a first electrode and printing a second conductive paste on a back surface of the second insulating layer at locations corresponding to the second contact holes to form a second electrode.

The forming of the first insulating layer includes forming a lower layer using a passivation material having negative fixed charges, and forming an upper layer on a back surface of the lower layer using an anti-reflection coating material having positive fixed charges.

Aluminum oxide (AlO$_x$) or yttrium oxide (Y$_2$O$_3$) is used as the passivation material. Silicon nitride (SiNx) is used as the anti-reflection coating material.

The forming of the plurality of first contact holes includes performing a dry etching process on the upper layer using a laser, and performing a wet etching process on the lower layer using the upper layer as a mask.

According to the above characteristics of the solar cell, a portion of the electrode formed of the conductive paste is directly connected to the emitter region or the back surface field region through the contact holes.

Accordingly, even when the electrical connection between the electrode and a lower structure (for example, the emitter region or the back surface field region) of the solar cell is badly carried out in a process for firing the conductive paste, a reduction in a fill factor resulting from an increase in a contact resistance is prevented.

Because a material, for example, aluminum oxide or yttrium oxide using a field effect is used as the passivation material, an open-circuit voltage and a short circuit current density of the solar cell increase.

Both a front surface and a back surface of the substrate are formed as the textured surfaces, and a passivation layer and an anti-reflection layer are formed on each of the front surface and the back surface of the substrate. Therefore, light, which is incident on the front surface of the substrate and then passes through the substrate, is again incident on the back surface of the substrate and may be used to generate an electric current.

Accordingly, the solar cell according to the embodiment of the invention may increase its efficiency, compared to a solar cell generating the electric current using only light incident on the front surface of the substrate.

The method for manufacturing the solar cell according to the embodiment of the invention removes the upper layer, for example, the anti-reflection layer through the dry etching process using the laser and then removes the lower layer, for example, the passivation layer through the wet etching process using the upper layer as the mask, thereby forming the contact holes. Therefore, a damage of the substrate in the embodiment of the invention may be prevented, compared to the formation of the contact holes using only the laser. Further, a separate wet etching process for removing particles may be omitted.

Further, a contact area of the emitter region or the back surface field region may increase, compared to the formation of the contact holes using only the wet etching process. Therefore, a contact resistance may decrease.

Furthermore, because the contact hole has the dot shape, a damage of the substrate generated when the contact holes are formed may be reduced.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
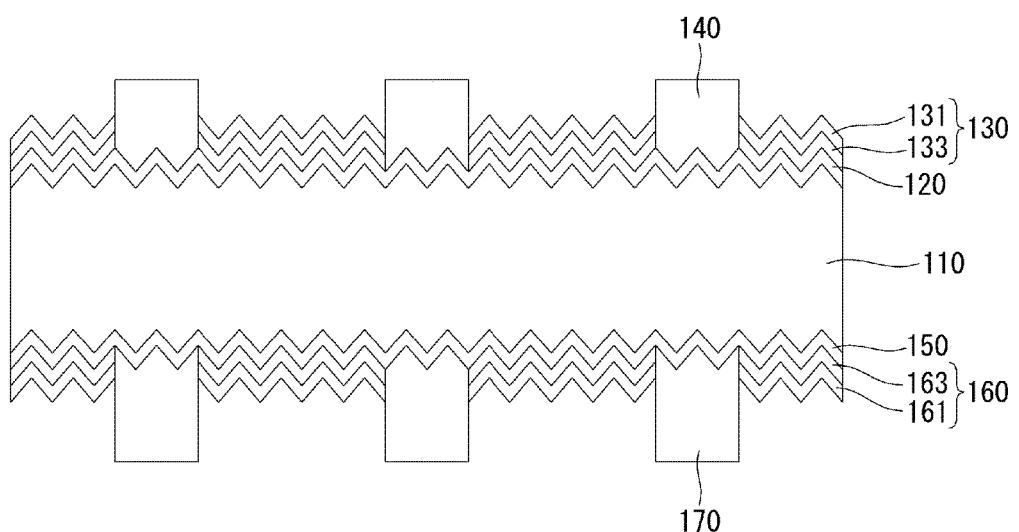
FIG. 1 is a schematic cross-sectional view of a solar cell according to an exemplary embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be paid attention that detailed description of known arts will be omitted if it is determined that the arts can mislead the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present.

In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Exemplary embodiments of the invention will be described in detail with reference to FIGS. 1 to 10.

Figure 2:
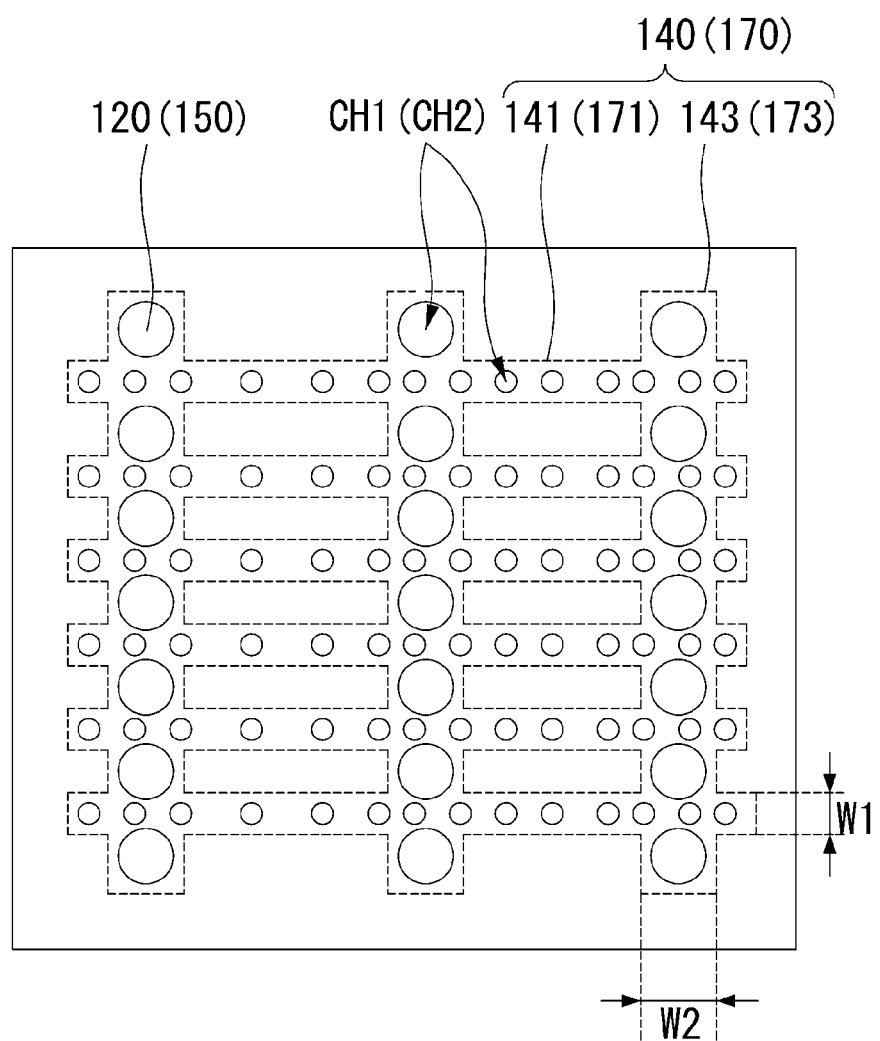
FIGS. 2 to 4 are plane views showing formations locations of a contact hole in a substrate.
Figure 3:
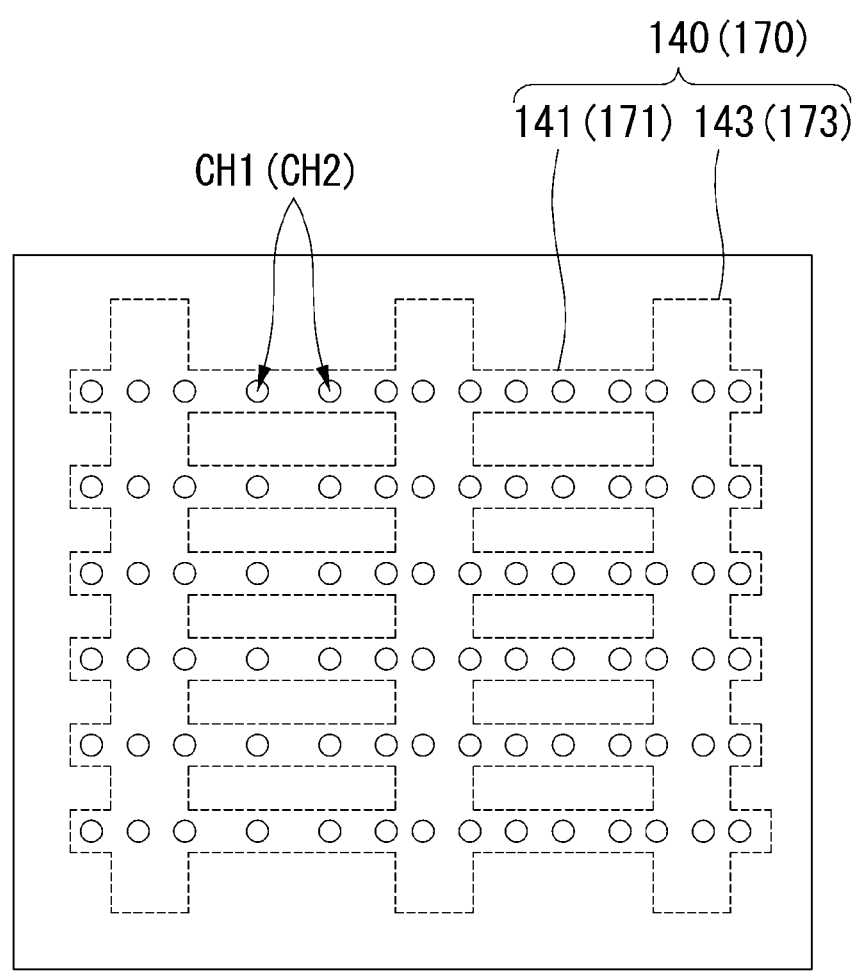
Figure 4:
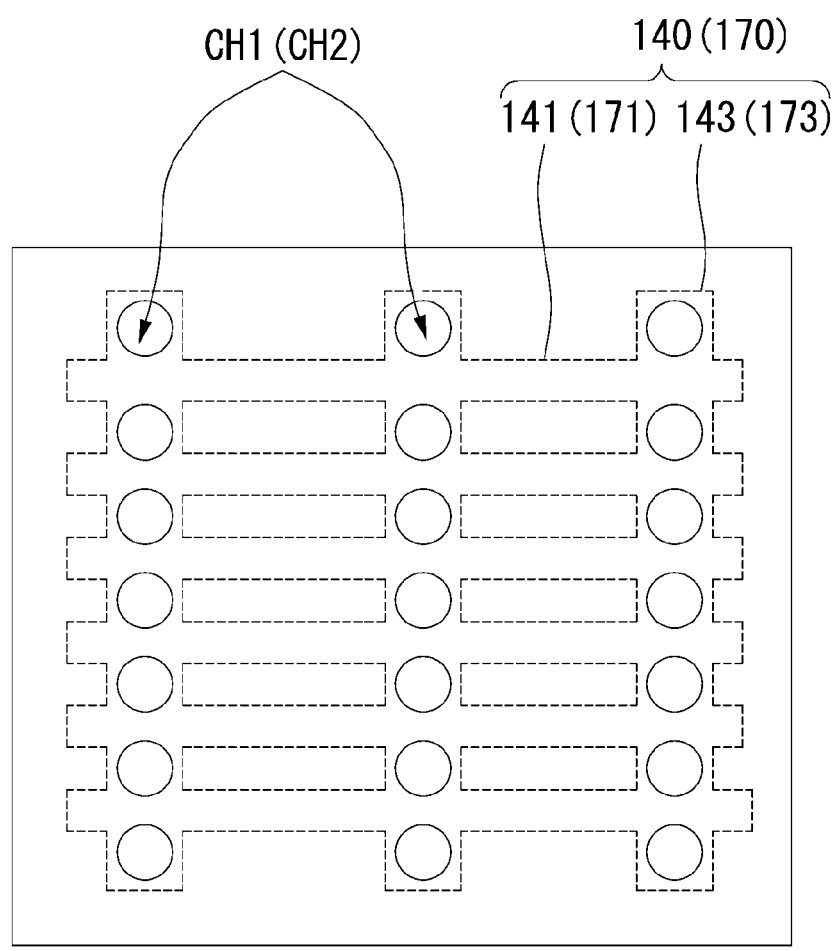

FIG. 1 is a schematic cross-sectional view of a solar cell according to an exemplary embodiment of the invention. FIGS. 2 to 4 are plane views showing formations locations of a contact hole in a substrate.

Figure 9:
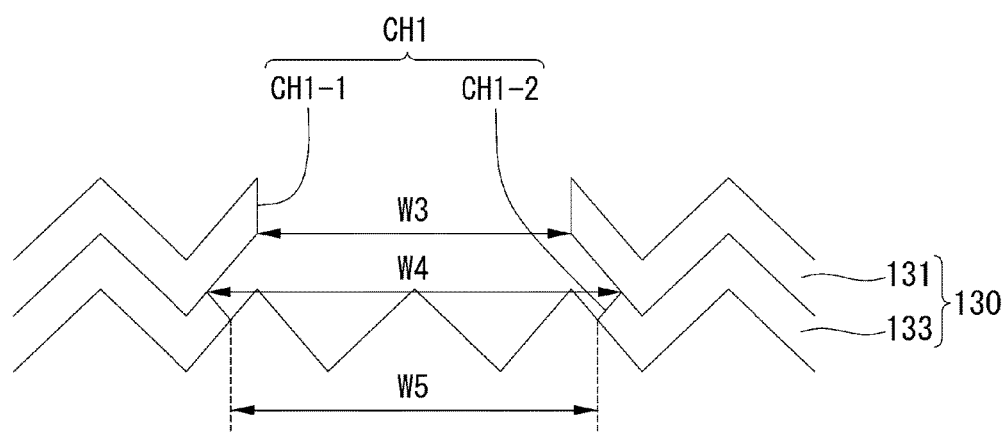
FIGS. 9 and 10 are enlarged cross-sectional views of a main part shown in FIG. 8.
Figure 10:
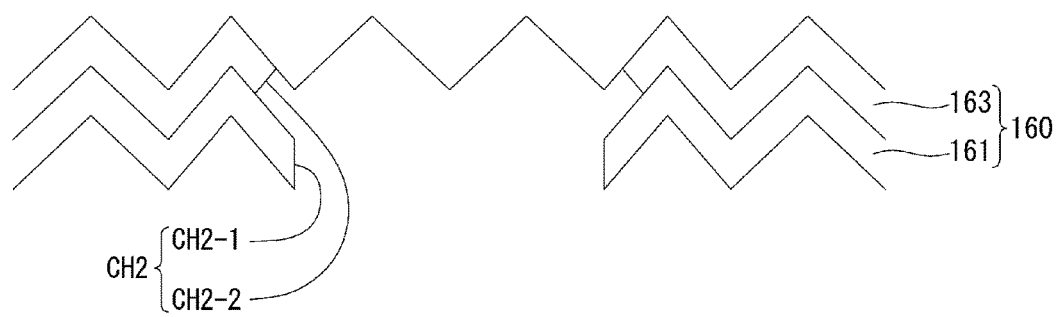

FIGS. 5 to 8 are cross-sectional views sequentially illustrating a method for manufacturing a solar cell according to an exemplary embodiment of the invention. FIGS. 9 and 10 are enlarged cross-sectional views of a main part shown in FIG. 8.

As shown in FIG. 1, a solar cell according to an exemplary embodiment of the invention includes a substrate 110, an emitter region 120 positioned at one surface of the substrate 110, for example, a front surface of the substrate 110, a first insulating layer 130 positioned on the emitter region 120, a first electrode 140 positioned on the emitter region 120 on which the first insulating layer 130 is not positioned, a back surface field (BSF) region 150 positioned at a back surface of the substrate 110, a second insulating layer 160 positioned on a back surface of the back surface field region 150, and a second electrode 170 positioned on the back surface of the back surface field region 150 on which the second insulating layer 160 is not positioned.

The substrate 110 may be formed of a silicon wafer of a first conductive type, for example, n-type, though not required. Silicon used in the substrate 110 may be single crystal silicon, polycrystalline silicon, or amorphous silicon.

When the substrate 110 is of the n-type, the substrate 110 may contain impurities of a group V element such as phosphorus (P), arsenic (As), and antimony (Sb).

Alternatively, the substrate 110 may be of a p-type and/or may be formed of a semiconductor material other than silicon.

If the substrate 110 is of the p-type, the substrate 110 may contain impurities of a group III element such as boron (B), gallium (Ga), and indium (In).

The surface of the substrate 110 may be textured to form a textured surface corresponding to an uneven surface or having uneven characteristics. More specifically, the substrate 110 has a first textured surface 111 at the front surface, at which the emitter region 120 is positioned, and a second textured surface 113 at the back surface, at which the back surface field region 150 is positioned.

The emitter region 120 positioned at the first textured surface 111 of the front surface of the substrate 110 is an impurity region of a second conductive type (for example, p-type) opposite the first conductive type (for example, n-type) of the substrate 110. Thus, the emitter region 120 forms a p-n junction along with the substrate 110.

Carriers, i.e., electron-hole pairs produced by light incident on the substrate 110 are separated into electrons and holes by a built-in potential difference resulting from the p-n junction between the substrate 110 and the emitter region 120. Then, the separated electrons move to the n-type semiconductor, and the separated holes move to the p-type semiconductor.

Thus, when the substrate 110 is of the n-type and the emitter region 120 is of the p-type, the separated electrons move to the substrate 110 and the separated holes move to the emitter region 120. Hence, the electrons become major carriers in the substrate 110, and the holes become major carriers in the emitter region 120.

When the emitter region 120 is of the p-type, the emitter region 120 may be formed by doping impurities of a group III element such as boron (B), gallium (Ga), and indium (In) on the substrate 110.

Alternatively, if the substrate 110 is of the p-type, the emitter region 120 may be of the n-type. In this instance, the separated electrons move to the emitter region 120 and the separated holes move to the substrate 110.

As describe above, if the emitter region 120 is of the n-type in another embodiment of the invention, the emitter region 120 may be formed by doping impurities of a group V element such as phosphorus (P), arsenic (As), and antimony (Sb) on the substrate 110.

The first insulating layer 130 positioned on the emitter region 120 formed at the front surface of the substrate 110 is formed of metal oxide-based materials other than thermal oxide materials.

For example, the first insulating layer 130 includes a first upper layer 131 formed of an anti-reflection coating material, for example, silicon nitride (SiNx) having positive fixed charges and a first lower layer 133 positioned between the emitter region 120 and the first upper layer 131.

The first lower layer 133 is formed of a passivation material having negative fixed charges, for example, aluminum oxide ($AlO_x$) or yttrium oxide ($Y_2O_3$). The passivation material of the first lower layer 133 may increase an open-circuit voltage and a short circuit current density of the solar cell.

In the embodiment of the invention, the first upper layer 131 functions as an anti-reflection layer, and the first lower layer 133 functions as a passivation layer.

As shown in FIGS. 2 to 4, the first electrode 140 is electrically and physically connected to the emitter region 120 and includes a plurality of front electrodes 141 and a plurality of front electrode current collectors 143. The plurality of front electrodes 141 extend substantially parallel to one another in a fixed direction. The plurality of front electrode current collectors 143 extend in a direction crossing the front electrodes 141 and are electrically and physically connected to the front electrodes 141.

The first electrode 140 is formed of a first conductive paste including silver (Ag) and a glass frit and collects carriers (for example, holes) moving to the emitter region 120.

The first electrode 140 has to be electrically connected to the emitter region 120, so as to collect the holes.

Thus, when the first electrode 140 is formed using the first conductive paste, the first insulating layer 130 is etched using an etching component included in the glass frit in a process for firing the first conductive paste. Then, the first conductive paste is filled in an etched portion of the first insulating layer 130, and thus the first electrode 140 is electrically connected to the emitter region 120.

However, when the first lower layer 133 of the first insulating layer 130 is formed of aluminum oxide ($AlO_x$) or yttrium oxide ($Y_2O_3$) so as to increase the open-circuit voltage and the short circuit current density of the solar cell, the electrical connection between the first electrode 140 and the emitter region 120 is not smoothly carried out because of material characteristics of the first lower layer 133. Hence, a contact resistance between them increases, and a fill factor of the solar cell is reduced.

Namely, when the first lower layer 133 is formed of aluminum oxide ($AlO_x$) or yttrium oxide ($Y_2O_3$), the etching of the first insulating layer 130 using an etching component of the first conductive paste is not smoothly carried out.

Accordingly, the first insulating layer 130 has a plurality of first contact holes CH1 each having a dot shape, so as to prevent an increase in the contact resistance and a reduction in the fill factor in the solar cell according to the embodiment of the invention.

The first contact hole CH1 may have various shapes. For example, the first contact hole CH1 may have a quadrangle shape, a rectangle shape, a snowman shape, etc. Alternatively, the first contact hole CH1 may have a line shape having a width less than the front electrode 141 or the front electrode current collector 143.

As shown in FIG. 2, the plurality of first contact holes CH1 may be formed in both a formation area of the plurality of front electrodes 141 and a formation area of the plurality of front electrode current collectors 143. Alternatively, as shown in FIG. 3, the plurality of first contact holes CH1 may be formed only in the formation area of the plurality of front electrodes 141. Alternatively, as shown in FIG. 4, the plurality of first contact holes CH1 may be formed only in the formation area of the plurality of front electrode current collectors 143.

The first contact holes CH1 may be arranged at regular intervals or at irregular intervals and may partially overlap each other.

As shown in FIG. 3, when the plurality of first contact holes CH1 are formed in the formation area of the plurality of front electrodes 141, a size of each first contact hole CH1 may be less than a width W1 of each front electrode 141.

As shown in FIG. 4, when the plurality of first contact holes CH1 are formed in the formation area of the plurality of front electrode current collectors 143, a size of each first contact hole CH1 may be less than a width W2 of each front electrode current collector 143.

On the other hand, as shown in FIG. 2, when the plurality of first contact holes CH1 are formed in the formation area of the plurality of front electrodes 141 and the formation area of the plurality of front electrode current collectors 143, a size of each first contact hole CH1 formed in the formation area of the front electrodes 141 may be less than a size of each first contact hole CH1 formed in the formation area of the front electrode current collectors 143.

Even in this instance, the size of each first contact hole CH1 formed in the formation area of the front electrodes 141 may be less than the width W1 of the front electrode 141. Further, the size of each first contact hole CH1 formed in the formation area of the front electrode current collectors 143 may be less than the width W2 of each front electrode current collector 143.

As described above, when the first insulating layer 130 has the plurality of first contact holes CH1, the first conductive paste is filled in the first contact holes CH1 in a process for printing the first conductive paste. Therefore, even if the etching of the first insulating layer 130 using the etching component of the first conductive paste is badly carried out in the process for firing the first conductive paste, an increase in the contact resistance may be prevented.

A maximum width of the first contact hole CH1 positioned in the first lower layer 133 adjacent to the substrate 110 may be different from a maximum width of the first contact hole CH1 positioned in the first upper layer 131. An area and an average diameter of the first contact hole CH1 positioned in the first lower layer 133 may be greater than an area and an average diameter of the first contact hole CH1 positioned in the first upper layer 131.

More specifically, the first contact hole CH1 includes a first portion CH1-1 positioned in the first upper layer 131 and a second portion CH1-2 positioned in the first lower layer 133. A maximum width of the first portion CH1-1 is different from a maximum width of the second portion CH1-2.

The first portion CH1-1 has a uniform width W3. The second portion CH1-2 has a width W4 close to the first portion CH1-1 and a width W5 which is close to the substrate 110 and is less than the width W4. Thus, the first portion CH1-1 has the maximum width W3, and the second portion CH1-2 has the maximum width W4 and the minimum width W5.

According to the above-described structure, the side of the first upper layer 131 exposed by the first portion CH1-1 of the first contact hole CH1 is formed in a straight line shape, and the side of the first lower layer 133 exposed by the second portion CH1-2 of the first contact hole CH1 is formed in a curved surface shape.

The width W4 of an upper part of the second portion CH1-2 is greater than the width W3 of the first portion CH1-1, and an upper part and a lower part of the first portion CH1-1 have the same width W3.

The width W4 of the upper part of the second portion CH1-2 is greater than the width W5 of a lower part of the second portion CH1-2, and the width W5 of the lower part of the second portion CH1-2 is greater than the width W3 of the lower part of the first portion CH1-1.

In the embodiment of the invention, the width W3 of the lower part of the first portion CH1-1 is a separation distance between the first upper layers 131 measured at a lower surface of the first upper layer 131. The width W3 of the upper part of the first portion CH1-1 is a separation distance between the first upper layers 131 measured at an upper surface of the first upper layer 131.

Further, the width W4 of the upper part of the second portion CH1-2 is a separation distance between the first lower layers 133 measured at an upper surface of the first lower layer 133. The width W5 of the lower part of the second portion CH1-2 is a separation distance between the first lower layers 133 measured at a lower surface of the first lower layer 133.

Thus, a contact surface between the first electrode 140 and the first upper layer 131 is a flat surface, and a contact surface between the first electrode 140 and the first lower layer 133 is a curved surface.

The widths W4 and W5 of the upper part and the lower part of the second portion CH1-2 may be adjusted depending on etching conditions of the first insulating layer 130.

The back surface field region 150 is formed at the entire back surface of the substrate 110. The back surface field region 150 is a region (for example, an $n^+$-type region) that is more heavily doped than the substrate 110 with impurities of the same conductive type as the substrate 110.

Thus, a potential barrier is formed by a difference between impurity concentrations of the substrate 110 and the back surface field region 150, thereby preventing or reducing the movement of holes to the back surface of the substrate 110. Hence, the back surface field region 150 prevents or reduces a recombination and/or a disappearance of electrons and holes at and around the surface of the substrate 110.

The second insulating layer 160 and the second electrode 170 are positioned on the back surface of the back surface field region 150.

The second insulating layer 160 reduces a reflectance of light incident on the solar cell through the back surface of the substrate 110 and increases selectivity of a predetermined wavelength band, thereby increasing the efficiency of the solar cell. The second insulating layer 160 functions as a passivation layer.

The second insulating layer 160 may have the same structure as the first insulating layer 130. Namely, the second insulating layer 160 includes a second upper layer 161 formed of hydrogenated silicon nitride (SiNx: H) and a second lower layer 163 which is positioned between the back surface field region 150 and the second upper layer 161 and is formed of aluminum oxide ($AlO_x$) or yttrium oxide ($Y_2O_3$).

On the other hand, the second insulating layer 160 may have a structure different from the first insulating layer 130. For example, the second insulating layer 160 may have a single-layered structure. Even if the second insulating layer 160 may have a double-layered structure including the second upper layer 161 and the second lower layer 163, the second upper layer 161 and the second lower layer 163 may be formed of materials different from the first upper layer 131 and the first lower layer 133 of the first insulating layer 130, respectively.

The second insulating layer 160 includes a plurality of second contact holes CH2 exposing a portion of the back surface field region 150. The second electrode 170 is formed on a back surface of the second insulating layer 160 and is electrically connected to the back surface field region 150 through the second contact holes CH2.

The second contact holes CH2 may have the same structure, the same shape, and the same position as the first contact holes CH1 shown in FIGS. 2 to 4, and thus a further description may be briefly made or may be entirely omitted.

However, when the second insulating layer 160 has the material, the layer structure, or the etching conditions different from the first insulating layer 130, the second contact holes CH2 may have the structure and the shape different from the first contact holes CH1.

The second electrode 170 positioned on the back surface of the back surface field region 150 collects carriers (for example, electrons) moving to the substrate 110 and outputs the carriers to an external device.

The second electrode 170 is formed of a second conductive paste. The second conductive paste may be the same as or different from the first conductive paste.

The second electrode 170 includes a plurality of back electrodes 171, which are formed on the back surface of the second insulating layer 160 at locations corresponding to the front electrodes 141, and a plurality of back electrode current collectors 143, which are formed on the back surface of the second insulating layer 160 at locations corresponding to the front electrode current collectors 143.

The second electrode 170 may have the same structure as the first electrode 140. For example, the second electrode 170 may have the same location and the same width as the first electrode 140. Alternatively, the second electrode 170 may have a width greater than the first electrode 140, so as to secure a line resistance.

The solar cell having the above-described structure according to the embodiment of the invention may be used as a bifacial solar cell, and an operation of the solar cell is described below.

When light irradiated onto the solar cell is incident on the substrate 110 through the emitter region 120 and/or the back surface field region 150, a plurality of electron-hole pairs are generated in the substrate 110 by light energy produced by the light incident on the substrate 110.

Because the front surface and the back surface of the substrate 110 are respectively formed as the first textured surface 111 and the second textured surface 113, light reflectance in the front surface and the back surface of the substrate 110 is reduced. Further, because both a light incident operation and a light reflection operation are performed on the first and second textured surfaces 111 and 113 of the substrate 110, light is confined in the solar cell. Hence, a light absorptance and efficiency of the solar cell are improved.

In addition, a reflection loss of light incident on the substrate 110 is reduced by the first insulating layer 130 and the second insulating layer 160. Thus, an amount of light incident on the substrate 110 further increases.

The electron-hole pairs are separated into electrons and holes by the p-n junction between the substrate 110 and the emitter region 120. Then, the separated electrons move to the n-type substrate 110, and the separated holes move to the p-type emitter region 120.

As described above, the electrons moving to the substrate 110 move to the second electrode 170 through the back surface field region 150, and the holes moving to the emitter region 120 move to the first electrode 140.

Accordingly, when the first electrode 140 of one solar cell is connected to the second electrode 170 of another solar cell adjacent to the one solar cell using electric wires, for example, an interconnector, electric current flows therein to thereby enable use of the current for electric power.

The solar cell having the above-described configuration may be used in a state where the solar cell is positioned between a light transmission front substrate and a light transmission back substrate and is sealed by a protective layer.

A method for manufacturing the solar cell having the above-described configuration may include forming an emitter region at one surface of a substrate and forming a back surface field region at the other surface of the substrate; forming a first insulating layer on the emitter region and forming a second insulating layer on a back surface of the back surface field region; forming a plurality of first contact holes each having a dot shape in the first insulating layer and forming a plurality of second contact holes each having a dot shape in the second insulating layer; and printing a first conductive paste on the first insulating layer at locations corresponding to the first contact holes to form a first electrode and printing a second conductive paste on a back surface of the second insulating layer at locations corresponding to the second contact holes to form a second electrode.

A method for manufacturing the solar cell having the above-described configuration according to the embodiment of the invention is described in detail below.

Figure 5:
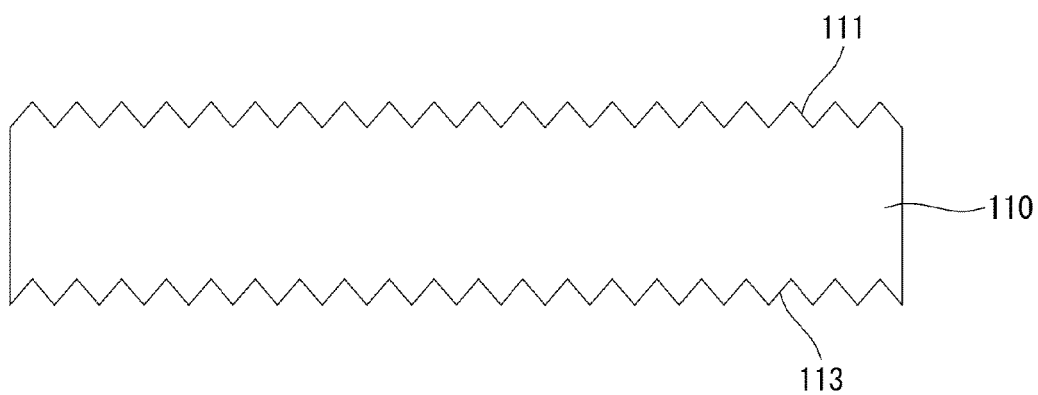
FIGS. 5 to 8 are cross-sectional views sequentially illustrating a method for manufacturing a solar cell according to an exemplary embodiment of the invention.
Figure 6:
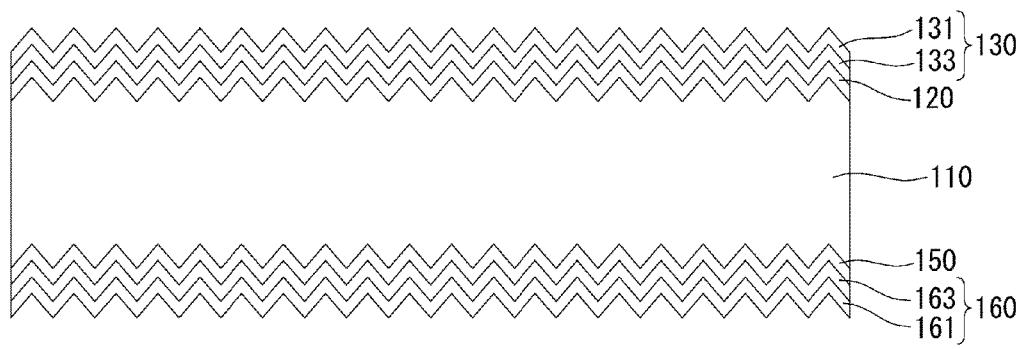
Figure 7:
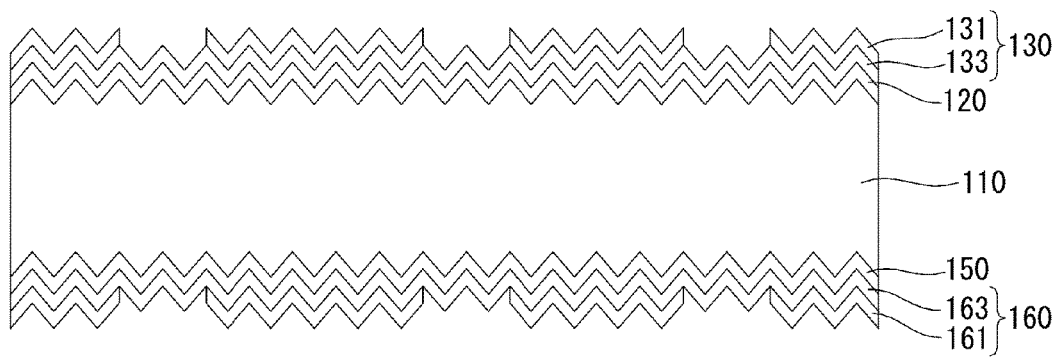
Figure 8:
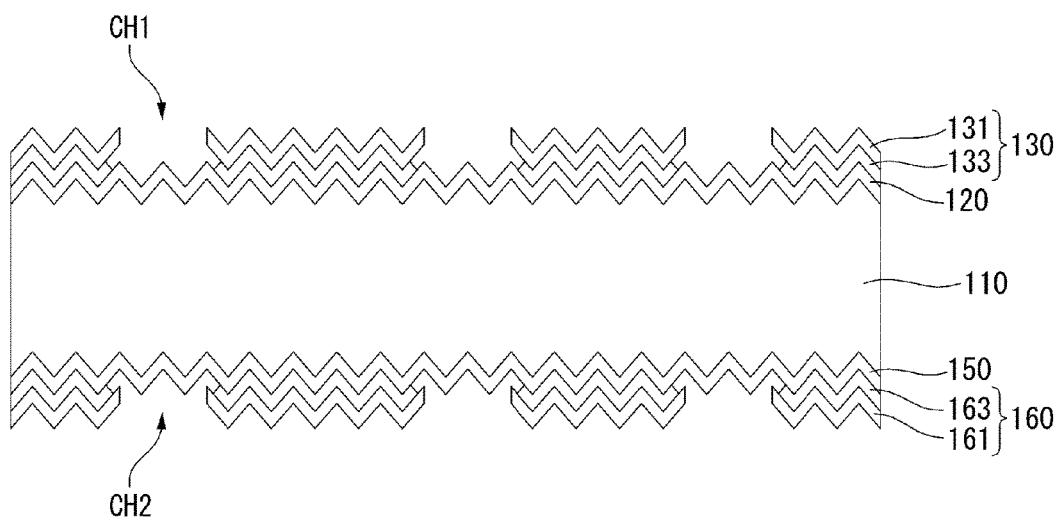

First, as shown in FIG. 5, a first textured surface 111 is formed at a front surface of a substrate 110 for a solar cell, and a second textured surface 113 is formed at a back surface of the substrate 110.

More specifically, the substrate 110 formed of a silicon wafer is generally manufactured by slicing a silicon block or an ingot using a blade or a multi-wire saw.

The silicon wafer is provided, and then impurities of a group V element, for example, phosphorus (P) are doped on the silicon wafer. Hence, an n-type semiconductor substrate is manufactured as the substrate 110.

When the silicon block or the ingot is sliced, a mechanical damage layer is formed in the silicon wafer.

Accordingly, a wet etching process for removing the mechanical damage layer is performed, so as to prevent a reduction in characteristics of the solar cell resulting from the mechanical damage layer of the substrate 110. The wet etching process may use an alkaline etchant or an acid etchant.

After the mechanical damage layer is removed, the wet etching process or a dry etching process using plasma is performed to form the first textured surface 111 at the front surface of the substrate 110 and to form the second textured surface 113 at the back surface of the substrate 110.

After the first textured surface 111 and the second textured surface 113 are formed, impurities of a group III element are doped on the front surface of the substrate 110 to form an emitter region 120. Further, impurities of a group V element are doped on the back surface of the substrate 110 to form a back surface field region 150.

Subsequently, a natural oxide layer is removed by etching the substrate 110 using hydrofluoric acid (HF). A first insulating layer 130 is formed on the emitter region 120, and a second insulating layer 160 is formed on a back surface of the back surface field region 150.

The first insulating layer 130 and the second insulating layer 160 may be manufactured by depositing aluminum oxide or yttrium oxide using a plasma enhanced chemical vapor deposition (PECVD) method, a sputtering method, or other methods to form a lower layer and then depositing silicon nitride using the PECVD method, the sputtering method, or other methods to form an upper layer.

Afterward, a dry etching process using a laser is performed to partially remove a first upper layer 131 of the first insulating layer 130 and a second upper layer 161 of the second insulating layer 160. Hence, a first portion CH1-1 of a first contact hole CH1 and a third portion CH2-1 of a second contact hole CH2 are formed.

More specifically, in the dry etching process, the first upper layer 131 of the first insulating layer 130 and the second upper layer 161 of the second insulating layer 160 may be partially removed by irradiating UV laser having a wavelength of about 355 nm onto the first upper layer 131 and the second upper layer 161 at a frequency corresponding to a bonding energy of silicon nitride.

As described above, when the dry etching process using the laser is performed to form the first portion CH1-1 of the first contact hole CH1 and the third portion CH2-1 of the second contact hole CH2, a damage resulting from the laser is absorbed in a first lower layer 133 of the first insulating layer 130 and a second lower layer 163 of the second insulating layer 160. Thus, a damage of the substrate 110 resulting from the laser is prevented or reduced.

In addition, because the first contact hole CH1 and the second contact hole CH2 each have the dot shape, the damage of the substrate 110 resulting from the laser may prevented or reduced.

Subsequently, a selective wet etching process is performed to remove the first lower layer 133 of the first insulating layer 130 exposed through the first portion CH1-1 of the first contact hole CH1 and the second lower layer 163 of the second insulating layer 160 exposed through the third portion CH2-1 of the second contact hole CH2. Hence, a second portion CH1-2 of the first contact hole CH1 and a fourth portion CH2-2 of the second contact hole CH2 are formed.

As described above, when the first and second lower layers 133 and 163 are removed through the wet etching process, particles generated in the dry etching process are removed. Therefore, a separate wet etching process for removing the particles may be omitted.

The wet etching process uses an etchant capable of etching only the materials of the first and second lower layers 133 and 163. For example, a buffered oxide etchant (BOE) capable of selectively etching silicon nitride and metal oxide may be used as the etchant of the wet etching process.

According to the above-described method, a first electrode 140 positioned in the first contact holes CH1 and a second electrode 170 positioned in the second contact holes CH2 each have a shape, in which a lower part is wider than an upper part. Thus, a contact area between the first electrode 140 and the emitter region 120 or a contact area between the second electrode 170 and the back surface field region 150 may efficiently increase.

Furthermore, because the process for removing the damage resulting from the use of the laser and a wet cleansing process may be omitted, the number of processes may be reduced. Even if the laser is used, the damage of the substrate may be prevented.

Afterward, a first conductive paste obtained by mixing a mixture (Ag: Al) of silver (Ag) and aluminum (Al) and a glass frit is printed on the front surface of the substrate 110 in a first electrode pattern. A second conductive paste obtained by mixing silver (Ag) and a glass frit is printed on the back surface of the substrate 110 in a second electrode pattern. Then, a firing process is performed on the substrate 110.

The first and second insulating layers 130 and 160 are etched by an etching component contained in the glass frit in the firing process of the substrate 110. Thus, the first electrode 140 is electrically and physically connected to the emitter region 120, and the second electrode 170 is electrically and physically connected to the back surface field region 150.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
    an n-type substrate having a textured front surface and a textured back surface;
    an emitter region positioned on the textured front surface of the n-type substrate;
    a first insulating layer including a lower layer positioned on the emitter region and an upper layer positioned on the lower layer, the lower layer being formed of aluminum oxide or yttrium oxide having negative fixed charges and the upper layer being formed of an insulating material having positive fixed charges;
    a first electrode electrically connected to the emitter region, the first electrode including a plurality of front electrodes, which are separated from one another and extending in a first direction, and a plurality of front electrode current collectors extending in a second direction perpendicular to the first direction;
    a back surface field region positioned on the textured back surface of the n-type substrate;
    a second insulating layer positioned on a back surface of the back surface field region; and
    a second electrode electrically connected to the back surface field region through a plurality of contact holes in the second insulating layer, the second electrode including a plurality of back electrodes, which are separated from one another and extending in the first direction, and a plurality of back electrode current collectors extending in the second direction,
    wherein the first insulating layer includes a plurality of first contact holes and a plurality of second contact holes each passing through the upper and lower layers of the first insulating layer and each having a dot shape,
    wherein the plurality of first contact holes are separated from one another and positioned along the first direction of the plurality of front electrodes,
    wherein the plurality of second contact holes are separated from one another and positioned along the second direction of the plurality of front electrode current collectors,
    wherein a size of the plurality of second contact holes under the plurality of first electrode current collectors is bigger than a size of the plurality of first contact holes under the plurality of first electrodes,
    wherein portions of each of the plurality of front electrodes are filled in the plurality of first contact holes and electrically connected to the emitter region, and portions of each of the plurality of front electrode current collectors are filled in the plurality of second contact holes and electrically connected to the emitter region,
    wherein the plurality of first contact holes and the plurality of second contact holes are positioned under one front electrode current collector of the plurality of front electrode current collectors along the second direction of the plurality of front electrode current collectors,
    wherein each of the plurality of first contact holes and each of the plurality of second contact holes includes a first portion positioned in the upper layer of the first insulating layer and a second portion positioned in the lower layer of the first insulating layer, and
    wherein a maximum width of the second portion in the first direction and the second direction is larger than a maximum width of the first portion in the first direction and the second direction.

2. The solar cell of claim 1, wherein the insulating material includes silicon nitride (SiNx).

3. The solar cell of claim 1, wherein the maximum width of the first portion of the plurality of first contact holes in the second direction is less than a width of the plurality of front electrodes in the second direction, and the maximum width of the first portion of the plurality of second contact holes in the first direction is less than a width of the plurality of front electrode current collectors in the first direction.

4. The solar cell of claim 1, wherein an average width of the second portion positioned in the lower layer of the first insulating layer is greater than an average width of the first portion positioned in the upper layer of the first insulating layer.

5. The solar cell of claim 1, wherein the first electrode including the plurality of front electrodes and the plurality of front electrode current collectors is formed of a plurality of conductive particles and a glass frit.

6. The solar cell of claim 1, wherein the plurality of contact holes in the second insulating layer include a plurality of third and fourth contact holes each having a dot shape, and wherein portions of each of the plurality of back electrodes are filled in the plurality of third contact holes, and portions of each of the plurality of back electrode current collectors are filled in the plurality of fourth contact holes.

7. The solar cell of claim 6, wherein the plurality of third contact holes are separated from one another and positioned along the first direction of the plurality of back electrodes, and the plurality of fourth contact holes are separated from one another and positioned along the second direction of a back electrode current collectors.

8. The solar cell of claim 7, wherein the n-type substrate is formed of n-type silicon wafer, on which phosphorus (P) is doped.

9. The solar cell of claim 8, wherein the second insulating layer has the same structure as the first insulating layer.

* * * * *